United States Patent [19]
Fedynyshyn et al.

[11] Patent Number: 5,302,490
[45] Date of Patent: Apr. 12, 1994

[54] RADIATION SENSITIVE COMPOSITIONS COMPRISING BLENDS OF AN ALIPHATIC NOVOLAK RESIN AND AN AROMATIC NOVOLAK RESIN

[75] Inventors: Theodore H. Fedynyshyn, Sudbury; Marc Connelly, Roslindale, both of Mass.

[73] Assignee: Shipley Company Inc., Marlborough, Mass.

[21] Appl. No.: 43,153

[22] Filed: Apr. 1, 1993

Related U.S. Application Data

[63] Continuation of Ser. No. 780,641, Oct. 21, 1991, abandoned.

[51] Int. Cl.$^5$ .................... G03C 1/76; G03F 7/023
[52] U.S. Cl. ........................... 430/271; 430/165; 430/168; 430/169; 430/191; 430/192; 430/193; 430/270; 430/272
[58] Field of Search ............... 430/191, 192, 193, 165, 430/270, 271, 272

[56] References Cited

U.S. PATENT DOCUMENTS

| | | | |
|---|---|---|---|
| 4,477,553 | 10/1984 | Yamamoto et al. | 430/192 |
| 4,551,409 | 11/1985 | Gulla et al. | 430/165 |
| 4,731,319 | 3/1988 | Kohara et al. | 430/192 |
| 4,797,346 | 1/1989 | Yamamoto et al. | 430/192 |
| 4,920,028 | 4/1990 | Lazarus et al. | 430/192 |
| 5,001,040 | 3/1991 | Blakeney et al. | 430/192 |
| 5,077,173 | 12/1991 | Shulz et al. | 430/192 |

*Primary Examiner*—Charles L. Bowers, Jr.
*Assistant Examiner*—John S. Chu
*Attorney, Agent, or Firm*—Robert L. Goldberg; Peter F. Corless

[57] ABSTRACT

The invention relates to radiation sensitive compositions having high uniformity when deposited as thick films. The compositions of the invention comprise a radiation sensitive component and a resin binder blend. The resin binder blend is a mixture of an aliphatic novolak resin component and an aromatic novolak resin component.

13 Claims, No Drawings

RADIATION SENSITIVE COMPOSITIONS COMPRISING BLENDS OF AN ALIPHATIC NOVOLAK RESIN AND AN AROMATIC NOVOLAK RESIN

This is a continuation of copending application Ser. No. 07/780,641 filed on Oct. 21, 1991, now abandoned.

BACKGROUND OF THE INVENTION

1. Introduction

This invention relates to radiation sensitive compositions comprising a radiation sensitive component and a resin binder blend. In particular, the resin blend is a mixture of novolak resins which can provide highly uniform and thick coating layers.

2. Discussion of Related Art

Radiation sensitive compositions include photoresist compositions which are well known in the art and described in numerous publications including DeForest, *Photoresist, Materials and Processes*, McGraw-Hill Book Company, New York, 1975. Photoresists comprise coatings produced from solution or applied as a dry film which, when exposed to radiation of an activating wavelength, are chemically altered in their solubility to certain solvents. Photoresists can be negative-acting or positive-acting. Negative-acting resists are initially soluble in its developer, but following exposure to activating radiation, become insoluble in developer, thereby defining a latent image. Positive-acting resists work in the opposite fashion, radiation exposure making the resist soluble in developer.

Positive-working resists in general comprise a radiation sensitive compound and a film forming polymer blend. The radiation sensitive compounds, or sensitizers as they are often called, most frequently used are esters and amides formed from o-quinone diazide sulfonic and carboxylic acids. These esters and amides are well known in the art and are described in DeForest, suora, pp. 47-55, incorporated herein by reference.

The resin binders often used with the o-quinone diazides in commercial practice are the alkali soluble phenol formaldehyde resins known as the novolak resins. Photoresists using such polymers are reported in U.K. Patent No. 1,110,017, incorporated herein by reference. These materials are the product of reaction of a phenol with formaldehyde under conditions whereby a thermoplastic polymer is formed.

Positive photoresists using novolak resins as binders are often used as masks to protect substrates from chemical etching in photo engraving processes. For example, in a conventional process for the manufacture of printed circuit boards, a copper-clad substrate is coated with a layer of a positive-working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by the development of the photoresist are dissolved while the portions of the wafer coated with the photoresist are protected, thereby defining a circuit pattern. For use in the manufacture of a semiconductor, the photoresist must possess resistance to chemical etchants, must adhere to the surface of the semiconductor wafer and must be capable of fine line image resolution.

For a number of processes, application of a thick photoresist film can be highly desirable. A coating film having a thickness of about 3.0 to 3.5 microns or greater is generally recognized and is referred to herein as a "thick" coating film. For an additive metallization process, a developed thick photoresist layer can be necessary. For example, it is often necessary to plate up a thickness of 5 microns or greater. To accomplish such plating, a developed photoresist image having well resolved sidewalls of a height equal to or greater than the thickness of plating is typically required.

Thick photoresist coatings also can be required to provide a uniform coating layer over topography. More specifically, in microelectronic applications, it is often necessary to apply a uniform coating layer over chip contact holes. To provide sufficient uniformity of the resist coating layer, application of a thick resist layer can be required.

Use of a metal plasma etch can also necessitate use of thick photoresist coatings. A metal plasma etch is typically quite aggressive to a photoresist film. By employing a thick resist film, a portion of the resist coating can be sacrificed during the plasma etch process without destroying the patterned image.

While the foregoing makes clear that photoresists that can be applied as thick films have significant utility, many known photoresists do not provide a highly uniform thick coating layer. Such lack of uniformity can be unacceptable for many applications.

It thus would be desirable to have a radiation sensitive composition that could be applied as a thick and uniform coating layer.

SUMMARY OF THE INVENTION

The present invention comprises radiation sensitive compositions that can be applied as thick and substantially uniform films. The invention is based at least in part upon the discovery of radiation sensitive compositions that comprise a blend of certain novolak resins as a binder, and that by incorporating such resin blends in a radiation sensitive composition, the composition can be applied to a substrate as a thick and substantially uniform coating layer. This resin blend comprises an admixture of an aromatic novolak resin and an aliphatic novolak resin. The uniformity of thick coating layers of the compositions of the invention are quite high, including a standard deviation of the thickness of the coating layer of about 30 nm or less across the coating layer.

The aromatic novolak resins of the resin blend of the invention are the condensation product of a phenolic compound and an aromatic aldehyde. The aliphatic novolak resins of the resin blend are the condensation product of a phenolic compound and an aliphatic aldehyde. While these resins may be suitably blended in a variety of ratios, the resin admixture preferably contains between about 20 and 50 weight percent of an aromatic novolak material, and more preferably the resin admixture contains between about 25 weight and 40 weight percent of an aromatic novolak material.

The compositions of the invention also comprise a radiation sensitive compound. Depending on the radiation sensitive component employed, the compositions can be negative-acting or positive-acting. Suitable sensitizers include for example, a diazo compound or an azide compound.

The invention also provides methods that employ the described composition to produce high resolution relief images, including submicron images. The invention additionally provides a method for applying a thick photoresist layer on a substrate, the method comprising applying a coating layer of the described radiation sensitive composition on a substrate. Additionally, novel articles of manufacture are provided consisting of substrates coated with the compositions of the invention.

DESCRIPTION OF THE PREFERRED EMBODIMENTS

As described above, the invention is directed to radiation sensitive compositions that comprise a radiation sensitive component (i.e., sensitizer compound) and a resin binder blend. The resin binder blend comprises an admixture of an aromatic novolak resin and an aliphatic novolak resin. Novolak resins are typically formed from the condensation of one or more phenols and an aldehyde in the presence of strong acid and a divalent sulfur compound as catalyst. Pheols useful in the practice of the invention include phenols of the type conventionally used in the formation of novolak resins such as phenols, cresols, xylenols, resorcinols, naphthols and bisphenols. Preferred phenols include o-cresol, m-cresol, p-cresol, phenol, 2-phenyl phenol, 3-phenyl phenol, 4-phenyl phenol, 2,3-dimethyl phenol, 3,4-dimethyl phenol, 3,5-dimethyl phenol, 3,4,5-trimethyl phenol, p-ethyl phenol, p-propyl phenol, p-butyl phenol, p-nonyl phenol, bromophenols, fluorophenols, chlorophenols, trimethylsilylphenol, chloromethylphenols, acylphenols, p-hydroxybenzoic acid, p-nitro phenol, 2,6-bis(hydroxymethyl)-p-cresol and the like. The most preferred phenols for practice of the invention include the cresols and 2,6-bis(hydroxymethyl)-p-cresol.

The aliphatic novolak resins used in the resin binder blends of the invention are formed by the acid catalyzed condensation of an aliphatic aldehyde and any of the above described phenols. Aliphatic aldehydes useful in preparing the aliphatic novolak resins include formaldehyde or a formaldehyde precursor. As used herein, "formaldehyde precursor" refers to compounds, such as 1,3,5-S-trioxane and paraformaldehyde which, under the reaction conditions employed to prepare the novolak resin will produce formaldehyde. As used herein, the term "formaldehyde" is understood to include both formaldehyde per se and formaldehyde precursors.

The acid catalyzed condensation reaction which is carried out to prepare the aliphatic novolak resins is performed using art recognized techniques as described above and disclosed, for example, in U.S. Pat. Nos. 3,148,983, 4,404,357, 4,115,128, 4,377,631, 4,423,138, 424,315, and in DeForest, *Photoresist: Materials and Processes*, McGraw-Hill Book Company, 1975, all of which are incorporated herein by reference. The aliphatic novolak resins used in the compositions of the invention preferably have a molecular weight average of between about 4,000 and 20,000 daltons, and preferably have a molecular number average between about 1,000 and 3,000.

The aromatic novolak resins of the resin binder blends of the invention are formed by condensing any of the above described phenols with an aromatic aldehyde. The aromatic aldehyde is preferably one conforming to the following formula:

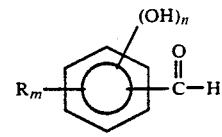

where R is a member selected from the group consisting of halogen, cyano, nitro, carboxyl, alkoxy or alkyl having from 1 to 5 carbon atoms; m is an integer ranging between 0 and 2 and n is a whole integer ranging between 0 and 3. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chloro benzaldehyde, 3-hydroxy benzaldehyde, 4-hydroxy benzaldehyde, 2-methoxy benzaldehyde, 3-nitro benzaldehyde, etc. Mixtures of these aromatic aldehydes may also be used.

As the acid catalyst used to form the aromatic novolak resins, there may be protonoic acids such as sulfuric acid, nitric acid, hydrochloric acid, perchloric acid, phosphoric acid, tolulene-sulfonic acid and methanesulfonic acid, and Lewis acids such as boron trifluoride, boron trifluoride complexes, e.g., a boron trifluoride ether complex, aluminum trichloride, tin tetrachloride, zinc chloride, ferric chloride and titanium tetrachloride. Among these acid catalysts, protonoic acids are preferred, and nitric acid, sulfuric acid, hydrochloric acid and p-toluene-sulfonic acid are especially preferred. The acid catalystiis ordinarily used in an amount of 0.1 to 10 parts by weight per 100 parts by weight of the phenol component. In addition, organic acids such as oxalic acid, maleic acid, and formic acid may also be used. In certain cases, an inorganic catalyst may also be used. These may include compounds of zinc, magnesium, manganese, aluminum, titanium, copper, nickel and cobalt.

The aromatic novolak resin component is formed by condensing the phenol with the aromatic aldehyde in the presence of a strong acid catalyst and a divalent sulfur compound The molar concentration of the aromatic aldehyde may be slightly less than that of the phenol compound. In this respect, the ratio of the phenol to the aldehyde may vary between about 1.1 to 1.0 and 1.0 to 1.1. Aromatic aldehydes, compared to formaldehydes, are less reactive towards condensation reactions leading to polymerization. However, under more vigorous reaction conditions, aromatic aldehydes can condense with a reactive phenol in the presence of a strong mineral or organic acid. By using a divalent sulfur compound with the strong acid catalyst, the condensation of the aromatic aldehyde with a reactive phenol results in the formation of polymers that are of high molecular weight, and more suitable for use as resins in a photoresist composition. Divalent sulfur compounds suitable for preparing useful aromatic novolak resins include ionizable compounds such as sulfur dichloride, sodium thiosulfate, hydrogen sulfide, sodium sulfide, thiols, thiophenols, thioacetic acid, thioglycolic acid, mercaptoalkyl sulfonic acid or hydroxyalkyl thiols.

The aromatic novolak resins are formed by mixing the reactants and a dehydrating solvent in a reactor and refluxing the mixture at an elevated temperature for a period of time sufficient to form a polymer having a weight average molecular weight in excess of 1500 daltons and typically in excess of about 2500 daltons, and a molecular number average typically in excess of about 800. The reactor may be any conventional condensation reactor equipped with an agitator, means for reflux and distillation and conventional heat transfer means as required to perform the reaction. In general, a preferred method for carrying out the condensation reaction is to dissolve the condensation agent (the aromatic aldehyde) and the aromatic alcohol in an appropriate dehydrating water miscible solvent and then add the acid catalyst and ionizable divalent sulfur compound as described above. The resultant mixture is agitated and heated to reflux over a period of time ranging from about 2 to 24 hours, during which the aromatic alcohol and the aldehyde condense. The condensation reaction typically involves the formation of low molecular weight intermediates which initially form and then rearrange and combine with each other at a later stage to form higher molecular weight polymers.

Following reflux, excess water is removed from the condensate and the condensate is then subjected to distillation at a temperature of from 120° to 180° C. to complete the condensation reaction. The resin solution is then typically diluted with more solvent and added to excess water to precipitate the resin. The resin is then washed with water and dried at elevated temperature under vacuum. The resin will typically have a glass transition temperature of at least about 125° C.

The resin blend of the invention may be formed by a number of means. For example, the two resins, in finely divided powder form or in solution may be mixed with each other using methods known to the art. The aromatic novolak and aliphatic novolak resins may be blended in a variety of ratios to provide the resin blend of the compositions of the invention. Preferably, the resin blend comprises at least about 20 weight percent of the aromatic novolak resin, balance being the aliphatic novolak resin. More preferably, the resin blend comprises from about 20 to 50 weight percent of the aromatic novolak resin, balance being the aliphatic novolak resin. Still more preferably, the resin blend comprises from about 25 to 40 weight percent of the aromatic novolak resin, the balance being the aliphatic novolak resin. A resin blend that comprises about 25 weight percent of the aromatic novolak resin is particularly preferred. Other particularly suitable specific amounts include about 20 weight percent, about 30 weight percent, about 40 weight percent, or about 50 weight percent of the aromatic novolak resin in the aromatic novolak/aliphatic novolak resin blends of the invention.

To formulate a radiation sensitive composition using the resin binder blend of the invention, a radiation sensitive compound is admixed with the resin blend using art recognized procedures. The radiation sensitive compound used may be any of the various radiation sensitive compounds known to be suitable as sensitizers in photoresists comprising an alkali soluble polymer binder. Examples of such compounds include esters and amides formed from o-quinone diazide sulfonic and carboxylic acids. Additionally, sulfonic amide sensitizers and aromatic azide sensitizers may be used. Preferred sensitizers include esterified diazo napthoquinone compounds, including triesterfied diazo napthoquinone compounds. Specifically preferred sensitizers include the 2,1,4-diazonaphthoquinone sulfonic esters and the 2,1,5-diazonaphthoquinone sulfonic acid esters. Other naphthoquinone diazide sulfonic acid esters suitable as sensitizers in the compositions of the invention are disclosed in Kosar, *Light Sensitive Systems,* John Wiley & Sons, 1965, pp. 343 to 352, incorporated herein by reference. The amount of the sensitizer used and the manner of preparing the radiation sensitive composition is in accordance with art recognized procedures. In this respect, dependent upon the specific sensitizer and resin binder blend, the sensitizer can vary from 0.1 to 50 weight percent of the composition and preferably varies between about 5 and 25 percent by weight of the formulation.

The compositions of the invention optionally may include one or more surfactants to avoid striations in a coating layer of the composition. Suitable surfactants are those generally known in the art and include, for example, Silwet surfactant-L7604 available from Union Carbide.

The compositions of the invention are generally prepared following prior art procedures for the preparation of photoresists and other photocurable compositions with the exception that the polymer resin blend as described above is substituted for the conventional resins used in the formulation of such compositions. The compositions of the invention are formulated as a coating composition by dissolving the components of the composition in a suitable solvent such as, for example, a glycol ether such as 2-methoxyethyl ether (diglyme), ethylene glycol monomethyl ether, ethylene glycol monomethyl ether, propylene glycol monomethyl ether; a Cellosolve ester such as methyl Cellosolve acetate; an aromatic hydrocarbon such as toluene or xylene; or a ketone such as methylethyl ketone. The solids content of the composition can vary widely, for example, the solids can vary from between about 5 and 65 percent by weight of the total weight of the radiation sensitive composition. For applying a thick coating layer of the composition, a relatively high solids content composition can be employed, for example a composition comprising about 50 percent by weight solids, or even a composition comprising about 60 to 65 percent by weight solids.

The compositions of the invention are used in accordance with generally known procedures for processing photoresists. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning. To apply a thick coating layer of the composition of the invention, a variety of spinning speeds can be employed. For example, for applying a coating layer of a thickness of about 10 microns or less, speeds of between about 3,000 and 5,000 revolutions per minute (r.p.m.) can be suitable. For application of coating layers in excess of about 10 microns thickness, slower speeds often will be suitable, for example speeds of from several hundred to 3,000 r.p.m.

The compositions of the invention are applied to substrates conventionally used in processes involving coating with photoresists. For example, a composition of the invention may be applied over silicon or silicon dioxide wafers for the production of microprocessors and other integrated circuit components. Aluminum - aluminum oxide and silicon nitride wafers can also be coated with the photocurable compositions of the invention. Another suitable use of the compositions of the invention is as a planarizing layer or for formation of multiple layers in accordance with art recognized procedures.

Following coating of the resist onto a surface, it is dried by heating to remove the solvent until preferably the resist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 1500 $mJ/cm^2$, dependent upon the exposure tool and the thickness of the coating layer. For thick films, such as coating layers about 3.0 microns or greater in thickness, relatively high exposure energies can be required, for example exposure energies ranging from 100 to 1,000 $mJ/cm^2$, or even as high as 1,500 $mJ/cm^2$. Depending on the radiation sensitive compound employed, a wide range of wavelengths of activating radiation can be suitably employed to expose the compositions of the invention.

Following exposure, the film layer of the composition may be baked if necessary and, thereafter, the film is developed. The exposed resist film can be developed with an aqueous based developer such as an inorganic alkali exemplified by sodium hydroxide, potassium hydroxide, sodium carbonate, sodium bicarbonate, sodium silicate, sodium metasilicate, or the like. Alternatively, organic developers can be used such as choline based solutions; quaternary ammonium hydroxide solutions such as a tetra-alkyl ammonium hydroxide solution; various amine solutions such as ethyl amine, n-propyl amine, diethyl amine, di-n-propyl amine, triethyl amine or, methyldiethyl amine; alcohol amines such as diethanol amine or triethanol amine; cyclic amines such as pyrrole, pyridine, etc. In general, development is in accordance with art recognized procedures.

The developed substrate may then be selectively processed on those substrate areas bared of resist, for example chemically etching or plating substrate areas bared of resist in accordance with procedures known in the art. For the manufacture of microelectronic substrates, for example the manufacture of silicon dioxide wafers, suitable etchants include a plasma gas etch and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

It is believed that a radiation sensitive composition of the invention can be uniformly coated to a layer thickness of up to 100 microns or greater, including coating layer thicknesses of from about 3 to 50 microns. More typically, the compositions of the invention are suitably employed to provide uniform coating layer thicknesses of from about about 3 to 20 microns and, for most thick film applications, to a layer of thickness of from about 3 to 10 microns. The compositions of the invention also provide uniform coating layers of thicknesses less than 3 microns.

The following examples are illustrative of the invention. Microns are expressed as um herein.

EXAMPLE 1

Preparation of Photoresist Compositions

Seven photoresist compositions (numbered 1-7 in Table 1 below) were prepared at 40 wt. % total solids. The seven resist compositions each contained 2.4 wt. % of 2,1,5-diazonaphthoquinone-2,6-bis(3,5-dimethyl-4-hydroxybenzyl)-4-methyl phenol, 2.4 wt. % of 2,1,5-diazonaphthoquinone-2,3,4-trihydroxybenzylbenzene, 35.2 wt. % of a mixture of a cresol-formaldehyde resin and a cresol-salicyaldehyde (the composition of the mixture specified in Table 1 below), 0.05 wt. % of Organo modified polymethyl siloxane (surfactant sold under the tradename Silwet surfactant-L7604 by Union Carbide) and 60.0 wt. % of solvent composed of a 90:5:5 (v/v) mixture of ethyl lactate, xylene, and n-butyl acetate. The cresol-formaldehyde resin employed had a molecular weight (weight average) of 6200, and the cresol-aromatic aldehyde had a molecular weight (weight average) of 2600. Table 1 below shows the composition of the resin binder blends of each of the seven resist compositions with the listed amounts of the resins expressed as weight percents:

TABLE 1

| Resist No. | Resin Binder Blends | |
|---|---|---|
| | Cresol-Formaldehyde | Cresol-Salicylaldehyde |
| 1 | 100 | 0 |
| 2 | 90 | 10 |
| 3 | 80 | 20 |
| 4 | 75 | 25 |
| 5 | 70 | 30 |
| 6 | 60 | 40 |
| 7 | 50 | 50 |

EXAMPLE 2

Processing of Photoresist Compositions

Lithographic evaluation of the seven photoresist compositions prepared in Example 1 was performed on an Ultratech 1000 G/H-Line Stepper with a 0.34 NA. The substrates were 4 inch silicon wafers which were vapor primed using hexamethyldisilazane. For the results reported in Table 2 below, a set of wafers were spin coated with one of the seven photoresist compositions of Example 1 using a standard process of spin coating on a GCA 1006 track system at 4000 r.p.m. for 30 seconds. For the results reported in Table 3 below, a set of wafers were each spin coated by a standard process with one of the seven photoresist compositions of Example 1 so that a 5 um thick coating layer was applied on each wafer. The resist coated wafers were soft-baked at 110° C. for 60 seconds on a vacuum hot plate. The exposure matrix was performed by stepping the exposure dose in increments of 5 $mJ/cm^2$ with a 0.0 micron defocus. Development was by static immersion in 0.255N aqueous tetramethylammonium hydroxide for 2 minutes at 21° C.

In Tables 2 and 3, the measurements of uniformity are expressed as nm and represent the standard deviation of the specified composition, across the surface of said coating layer, as determined by measuring four different film thickness points on a wafer. Coating layer thickness measurements were made with a Nanospec 215 on 4 equal distant points, 35 mm from the wafer center. The sensitivity was determined by the energy required to size 5.0 micron features. Viscosity measurements were performed with a Cannon-Fenske routine viscometer using the American Standard Test Methods STM D-445 test method at 25° C. Visocosity is expressed as center stoke (c.St.). As noted, Table 2 below sets forth the uniformity of the resist coating layers on the set of wafers obtained by applying a constant spin coating speed of 4,000 rpm; Table 3 below sets forth the uniformity of the coating layers on the set of wafers that had a constant coating layer thickness of 5 um; and in each Table, the photoresist of the specified number refers to a wafer coated with the photoresist of the same number as described in Example 1 above.

TABLE 2

| Coating layers applied at 4,000 r.p.m. | | | |
|---|---|---|---|
| Resist No. | Viscosity (c.St.) | Thickness (um) | Uniformity (nm) |
| 1 | 284 | 5.05 | 72.9 |
| 2 | 275 | 4.84 | 21.9 |
| 3 | 247 | 4.73 | 4.9 |
| 4 | 295 | 4.65 | 19.3 |
| 5 | 232 | 4.60 | 2.4 |
| 6 | 220 | 4.42 | 23.0 |
| 7 | 237 | 4.30 | 4.9 |

TABLE 3

| Coating layers of 5 μm thickness | | |
|---|---|---|
| Resist No. | Sensitivity (mJ/cm$^2$) | Uniformity (nm) |
| 1 | 162 | 90.4 |
| 2 | 173 | 107.7 |
| 3 | 172 | 30.8 |
| 4 | 175 | 12.3 |
| 5 | 173 | 16.7 |
| 6 | 187 | 4.9 |
| 7 | 200 | 2.8 |

The results set forth in the above Tables 2 and 3 show that as the amount of aromatic novolak component in the photoresist is increased, the standard deviation of the measured thickness decreases.

The foregoing description of the present invention is merely illustrative thereof, and it is understood that variations and modifications can be effected without departing from the spirit or scope of the invention as set forth in the following claims.

What is claimed is:

1. A method for applying a substantially uniform photoresist coating layer on a substrate, the coating layer having a thickness of at least about 3 microns, said method comprising applying a coating layer of a photoresist composition to a substrate, the photoresist coating layer having a thickness of at least about 3 microns and said thickness of the photoresist coating layer having a standard deviation of about 30 nm or less, the photoresist composition comprising an admixture of a resin binder and a radiation sensitizer compound, the sensitizer present in an amount sufficient to enable development following exposure of activating radiation, the resin binder being a blend of an aliphatic novolak resin and an aromatic novolak resin, said resin blend consisting of between about 20 and 40 weight percent of said aromatic novolak resin, the balance of said resin blend consisting of said aliphatic novolak resin and the aromatic novolak resin being the condensation product of a phenolic compound and a hydroxy-substituted aromatic aldehyde.

2. The method of claim 1 where the photoresist film layer has a thickness of between about 3 and 10 microns.

3. The method of claim 1 where said aromatic novolak resin is present in an amount of about 25 weight percent of the resin blend.

4. The method of claim 1 where said aromatic novolak resin is present in an amount of from about 25 to 40 weight percent of the resin blend.

5. The method of claim 1 where the photoresist composition consists essentially of said admixture of the resin binder and radiation sensitizer compound.

6. The method of claim 1 where the photoresist composition comprises about 50 weight percent or greater solids.

7. The method of claim 1 where the photoresist composition comprises between about 60 and 65 percent by weight solids.

8. An article comprising a substrate having a coating layer of radiation sensitive composition on the substrate surface, said composition coating layer having a thickness of about 3 microns or greater, and the thickness of the coating layer having a standard deviation of about 30 nm or less, the composition comprising an admixture of a resin binder and a radiation sensitizer compound, the sensitizer present in an amount sufficient to enable development following exposure to activating radiation, the resin binder being a blend of an aliphatic novolak resin and an aromatic novolak resin, said resin blend consisting of between about 20 and 40 weight percent of said aromatic novolak resin, the balance of said resin blend consisting of said alphatic novolak resin and the aromatic novolak resin being the condensation product of a phenolic compound and a hydroxy-substituted aromatic aldehyde.

9. The article of claim 8 where said aromatic novolak resin of the film layer is present in an amount of from about 25 to 40 weight percent of the resin blend.

10. The article of claim 8 where the composition consists essentially of said admixture of the resin binder and radiation sensitizer compound.

11. The article of claim 8 where the composition comprises about 50 weight percent or greater solids.

12. The article of claim 8 where the composition comprises between about 60 and 65 percent by weight solids.

13. The article of claim 8 where the aromatic novolak resin is present in an amount of about 25 weight percent of the resin blend.

* * * * *